United States Patent
Fan

(10) Patent No.: US 9,201,095 B2
(45) Date of Patent: *Dec. 1, 2015

(54) STRUCTURE OF BRIDGING ELECTRODE

(71) Applicant: Li-Li Fan, Taipei (TW)

(72) Inventor: Li-Li Fan, Taipei (TW)

(*) Notice: Subject to any disclaimer, the term of this patent is extended or adjusted under 35 U.S.C. 154(b) by 246 days.

This patent is subject to a terminal disclaimer.

(21) Appl. No.: 13/849,892

(22) Filed: Mar. 25, 2013

(65) Prior Publication Data

US 2013/0221992 A1     Aug. 29, 2013

Related U.S. Application Data

(62) Division of application No. 12/659,874, filed on Mar. 24, 2010, now Pat. No. 8,653,378.

(51) Int. Cl.
| | |
|---|---|
| *H05K 1/03* | (2006.01) |
| *H05K 1/02* | (2006.01) |
| *G06F 3/041* | (2006.01) |
| *G01R 1/067* | (2006.01) |
| *G06F 3/044* | (2006.01) |
| *H03K 17/96* | (2006.01) |

(52) U.S. Cl.
CPC ............ *G01R 1/06794* (2013.01); *G06F 3/041* (2013.01); *G06F 3/044* (2013.01); *H05K 1/03* (2013.01); *G06F 2203/04111* (2013.01); *H03K 2017/9602* (2013.01); *H05K 1/02* (2013.01); *H05K 1/0306* (2013.01)

(58) Field of Classification Search
CPC .......... G06F 3/044; G06F 2203/04111; G01R 1/06794; H03K 2017/9602
USPC .................................... 174/250–268; 345/173
See application file for complete search history.

(56) References Cited

U.S. PATENT DOCUMENTS

| | | | | |
|---|---|---|---|---|
| 8,653,378 | B2* | 2/2014 | Fan ................................ | 174/255 |
| 2009/0160824 | A1* | 6/2009 | Chih-Yung et al. ............ | 345/175 |
| 2009/0167708 | A1 | 7/2009 | Jiang et al. | |
| 2010/0182272 | A1* | 7/2010 | Kang et al. .................... | 345/174 |
| 2010/0265206 | A1 | 10/2010 | Chen | |
| 2010/0309163 | A1 | 12/2010 | Yeh et al. | |
| 2011/0069033 | A1 | 3/2011 | Meng et al. | |
| 2011/0090154 | A1 | 4/2011 | Kuo | |
| 2011/0132670 | A1 | 6/2011 | Yeh et al. | |
| 2011/0157086 | A1* | 6/2011 | Ozeki et al. ................... | 345/174 |

* cited by examiner

*Primary Examiner* — Ishwarbhai B Patel

(74) *Attorney, Agent, or Firm* — C. G. Mersereau; Nikolai & Mersereau, P.A.

(57) ABSTRACT

In a structure of a bridging electrode, the structure of a bridging electrode applied to a capacitive touchpad, the structure comprising: a substrate; a plurality of first electrode blocks disposed on the substrate and electrically connected together in series through a first wire; a plurality of second electrode blocks disposed on the substrate and respectively disposed on two sides of the first wire; and a bridging insulation unit, which is perpendicular to and disposed on the first wire and having a bridging groove; wherein the second electrode blocks connecting electrically together in series through the bridging insulation unit having a second wire.

3 Claims, 11 Drawing Sheets

A-A

STRUCTURE OF BRIDGING ELECTRODE

CROSS REFERENCE TO RELATED APPLICATIONS

This application is a divisional of Ser. No. 12/659,874, filed on Mar. 24, 2010. In addition, that divisional of Ser. No. 12/659,874 has been issued as U.S. Pat. No. 8,653,378.

BACKGROUND OF THE INVENTION (1) Field of the Invention

The present invention relates to a layout method and a structure of an electrode, and more particularly to a layout method and a structure of a bridging electrode, in which a special mask is utilized to form bridging grooves in an insulation unit so that the overall yields of wires disposed in the bridging grooves cannot be deteriorated owing to the subsequent manufacturing processes.

(2) Description of the Prior Art

In the prior art of manufacturing a capacitive touchpad, two electrodes are formed on a substrate along different axial directions, and then an insulating layer is formed on one of the electrodes so that the other one of the electrodes can be electrically connected to another element or portion through a metal wire disposed on the insulating layer.

However, the metal wire disposed conventionally insulating layer may be damaged in the subsequent manufacturing process so that the electrical connection cannot be made and the manufacturing yield of the capacitive touch pad is deteriorated.

In addition, the mask design of the typical factory, the line width for the production of the mask pattern is the same as the line width for the molded trace. Thus, the above-mentioned problem cannot be effectively overcome. After the development, the photoresist seriously remains, and the development may be incomplete or the over-development phenomenon may occur. Thus, the poor exterior (the edge of the trace has a sawtooth shape or a wavy shape) or the poor electrical connection (the reliability test is abnormal) tends to be caused after etching.

So, it is necessary to provide a new structure for effectively enhancing the yield of the capacitive touchpad.

SUMMARY OF THE INVENTION

It is therefore an object of the present invention to provide a layout method of a bridging electrode, in which a bridging groove is formed through a mask having a half tone pattern to prevent the wire, disposed on the bridging groove, from being damaged during the manufacturing process.

Another object of the present invention is to provide a structure of a bridging electrode, which has a bridging insulation unit to create an electrical connection between the electrodes, and is such that the wire connecting the electrodes together is disposed in the bridging groove lower than the height of the bridging insulation unit.

Still another object of the present invention is to provide a structure of a bridging electrode capable of compensating for the wires (such as the critical dimension loss) by adjusting the optical energy for exposure and/or making the optical energy and an optical compensation mask generate reactions there between in conjunction with the optical compensation mask.

To achieve the above-identified and other objects, the present invention provides a layout method of a bridging electrode. The method includes the steps of: (1) forming a transparent electro-conductive layer on the substrate, and the transparent electro-conductive layer has a plurality of neighboring patterned blocks; (2) forming an alignment film layer on the substrate and the alignment film layer has a plurality of bridging grooves of a bridging insulation unit crossing between the patterned blocks; (3) forming an electro-conductive layer on the substrate and the electro-conductive layer has a plurality of wires respectively disposed on the bridging grooves, wherein the wires of the electro-conductive layer are formed through an optical compensation mask in conjunction with at least one of over-exposure and over-development; and (4) forming a protection layer on the substrate to enhance optical transmission and to protect the substrate, the transparent electro-conductive layer, the alignment film layer and the electro-conductive layer.

To achieve the above-identified and other objects, the present invention provides a structure of a bridging electrode applied to a capacitive touchpad. The structure of the bridging electrode includes a substrate, first electrode blocks, second electrode blocks and a bridging insulation unit. The first electrode blocks are disposed on the substrate and electrically connected together in series through a first wire. The second electrode blocks are disposed on the substrate and respectively disposed on two sides of the first wire. The bridging insulation unit is perpendicular to and disposed on the first wire and has a bridging groove. The second electrode blocks are electrically connected together in series through the bridging insulation unit having a second wire.

To achieve the above-identified and other objects, the present invention provides a structure of a bridging electrode, which includes a substrate layer, a transparent electro-conductive layer, an alignment film layer and an electro-conductive layer. The transparent electro-conductive layer is disposed on at least one side of the substrate layer. The alignment film layer is disposed on one side of the substrate layer and the transparent electro-conductive layer. The electro-conductive layer is disposed adjacent to one side of the alignment film layer. In addition, the structure of the bridging electrode further includes a protection layer disposed on at least one side of the structure of the bridging electrode, wherein the protection layer is an organic material layer, a photoresist layer, an anti-reflective layer, an anti-gloss layer or a combination thereof.

Comparison between the present invention and the prior art will be made in the following. In the layout method and the structure of the bridging electrode of the present invention, the bridging groove of the bridging insulation unit is formed through the mask having the half tone pattern such that the electrodes extending in two directions on one substrate are insulated from each other when the connections between the electrodes are created. In addition, the structure having the bridging groove lower than the height of the bridging insulation unit enhance effectively the yield of the manufacturing process. More particularly, it is possible to adjust an optical energy for exposure and make the optical energy and the optical compensation mask generate reactions there between in conjunction with the optical compensation mask to compensate for the wires.

DETAILED DESCRIPTION OF THE PREFERRED EMBODIMENTS

Further aspects, objects, and desirable features of the present invention will be better understood from the detailed description and drawings that follow in which various embodiments of the disclosed invention are illustrated by way of examples.

Figure 1:
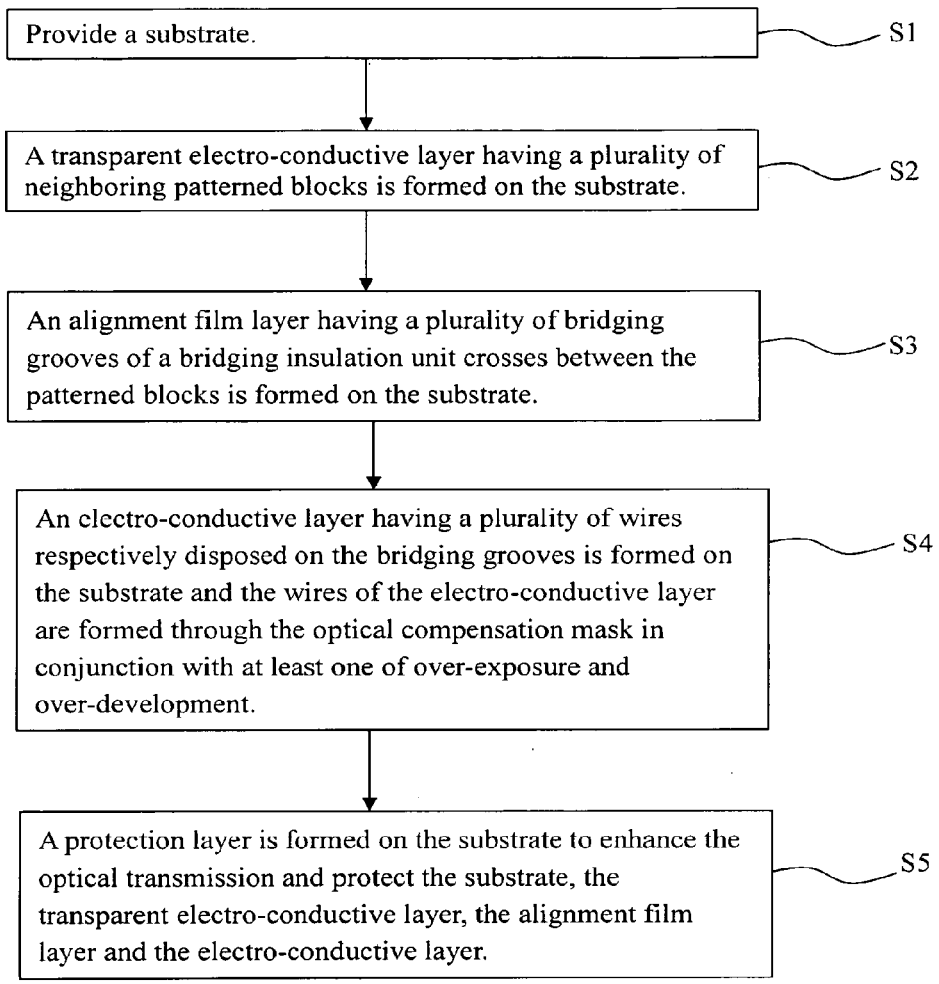
FIGS. 1 to 5 are schematic flowcharts showing a layout method of a bridging electrode according to an embodiment of the present invention.

FIGS. 1 to 5 are schematic flowcharts showing a layout method of a bridging electrode according to an embodiment of the present invention. In FIG. 1, the steps of the layout method of the bridging electrode starts from step S1 of providing a substrate. In step S2, a transparent electro-conductive layer having a plurality of neighboring patterned blocks is formed on the substrate. In step S3, an alignment film layer having a plurality of bridging grooves of a bridging insulation unit crosses between the patterned blocks is formed on the substrate. In step S4, an electro-conductive layer having a plurality of wires respectively disposed on the bridging grooves is formed on the substrate. The wires of the electro-conductive layer are formed through the optical compensation mask in conjunction with at least one of over-exposure and over-development. In step S5, a protection layer is formed on the substrate to enhance the optical transmission and protect the substrate, the transparent electro-conductive layer, the alignment film layer and the electro-conductive layer.

Figure 2:
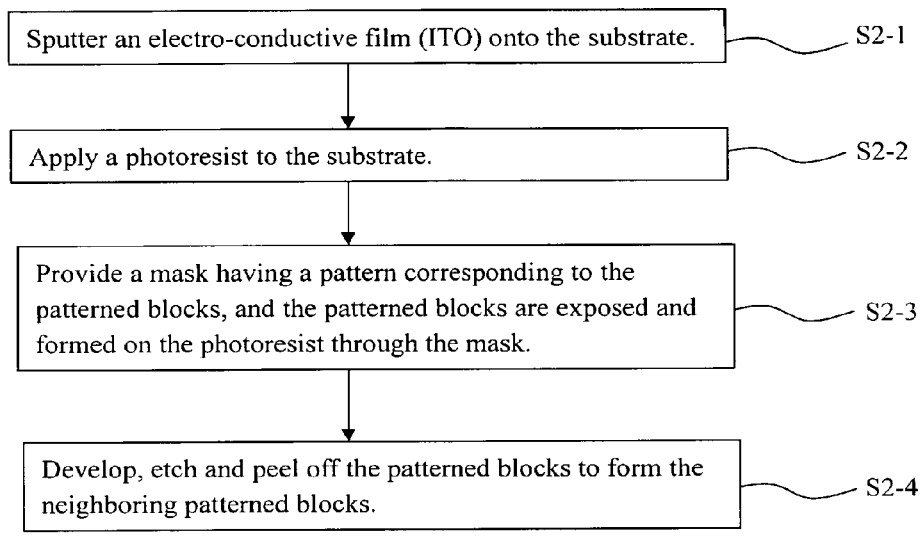

Furthermore, FIG. 2 shows the detailed sub-steps of the step S2. So the step of forming the transparent electro-conductive layer includes the following sub-steps. In step S2-1, an electro-conductive film (ex. ITO) is sputtered over the substrate. In step S2-2, a photoresist is applied to the substrate. In step S2-3, a mask corresponding to the patterned blocks is provided, and the patterned blocks are exposed and formed on the photoresist through the mask. In step S2-4, the patterned blocks are developed, etched and peeled off so that the neighboring patterned blocks can be formed.

Figure 3:
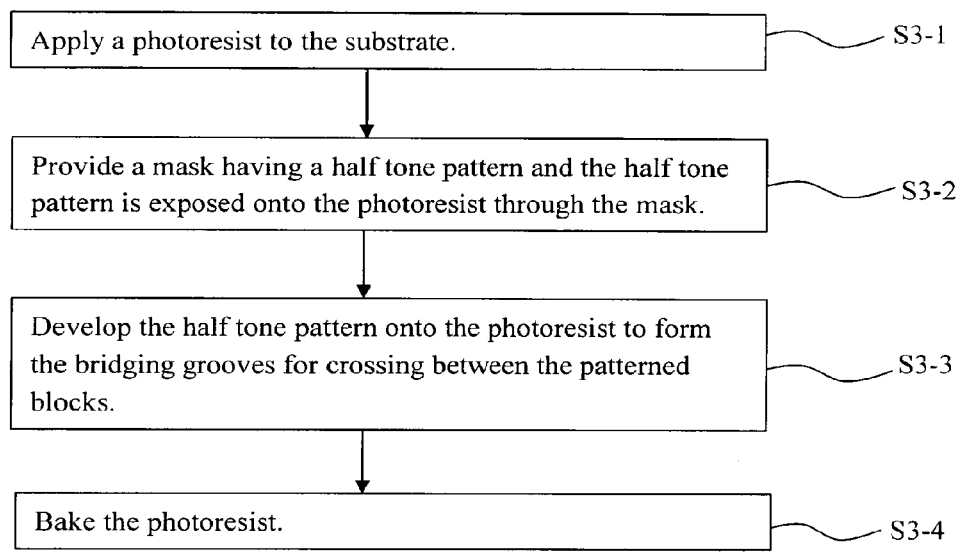
Figure 6A:
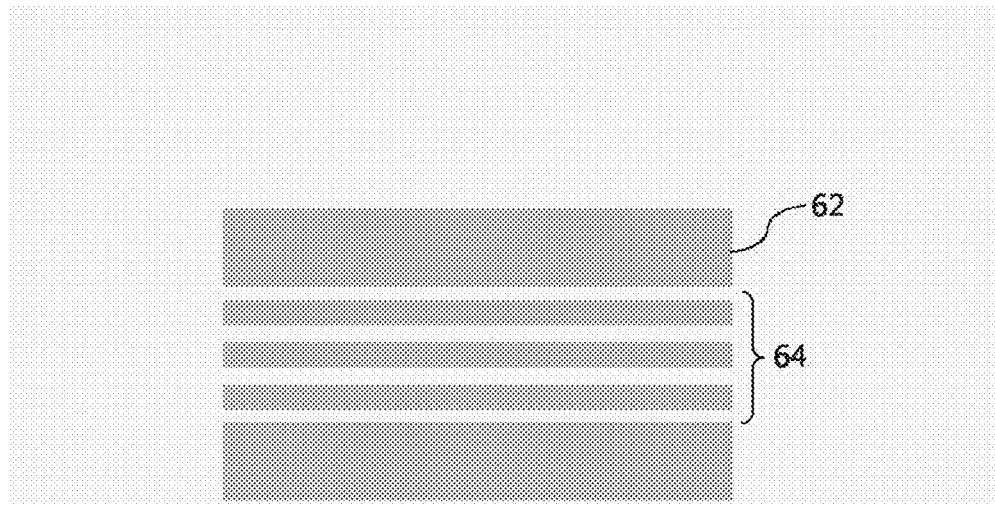
FIGS. 6a to 6c are schematic illustrations showing patterns on an optical compensation mask.
Figure 6B:
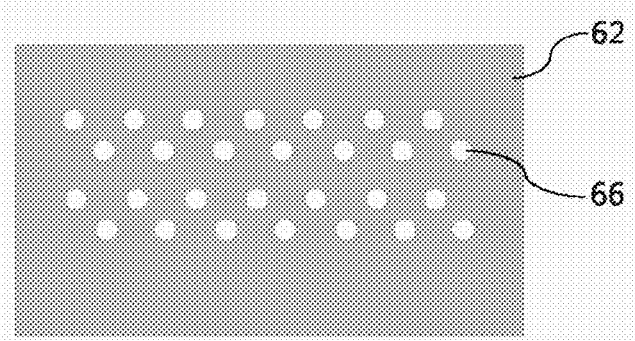
Figure 6C:
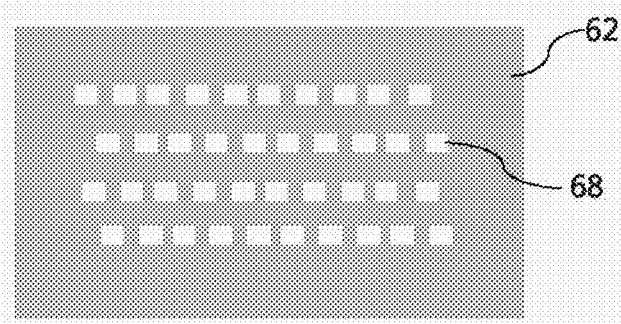

FIG. 3 shows the detailed sub-steps of the step S3. So, the step of forming the alignment film layer includes the following sub-steps. Start in step S3-1, a photoresist is applied to the substrate. In step S3-2, a mask having a half tone pattern is provided, and the half tone pattern is exposed on the photoresist through the mask. In step S3-3, the half tone pattern is developed onto the photoresist to form the bridging grooves crossing between the patterned blocks. In step S3-4, the photoresist is baked. In addition, the step of forming the half tone pattern of the mask includes providing an opaque region, having a line diameter greater than a line diameter (see FIG. 6a) of the half tone pattern, on a surface of the mask, or forming multiple holes, which may have circular shapes, rectangular shapes or any shapes, are uniformly disposed on the surface of the mask (see FIGS. 6b and 6c). In addition, the bridging groove is lower than a height of the bridging insulation unit after the photoresist of the bridging groove is developed through interference and diffraction actions caused by light rays on the half tone pattern during exposure (see FIG. 7d).

Figure 4:
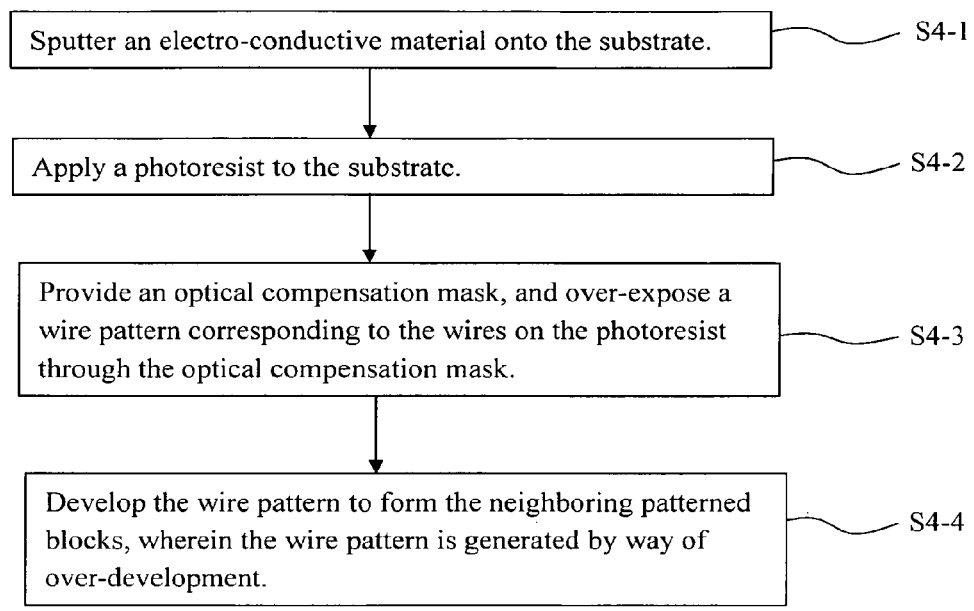
Figure 7A:
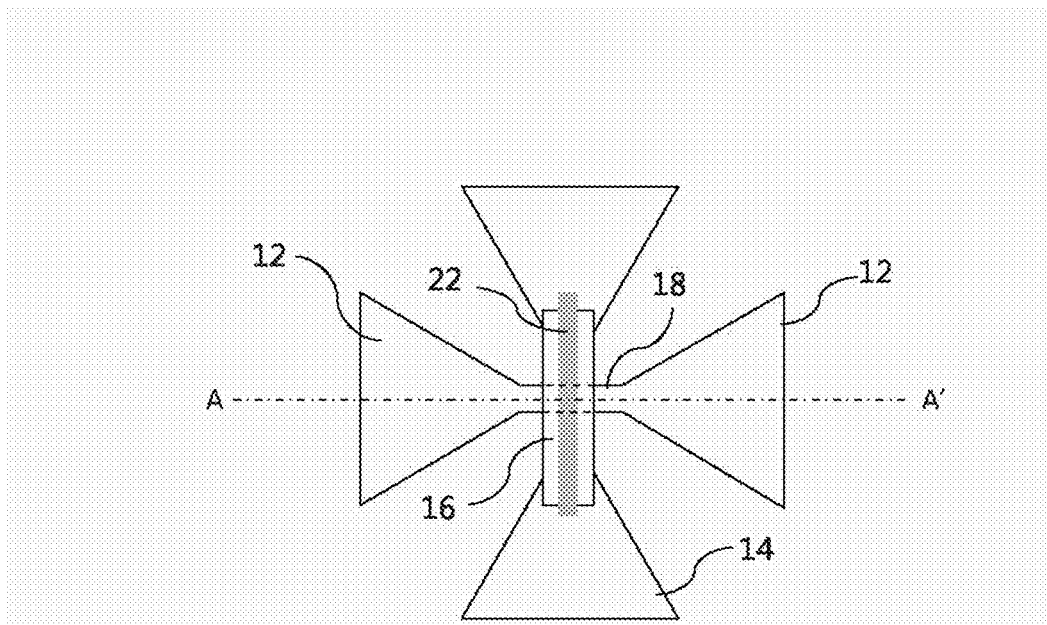
FIGS. 7a to 7d are schematic illustrations showing structures of bridging electrodes according to an embodiment of the invention.
Figure 7B:
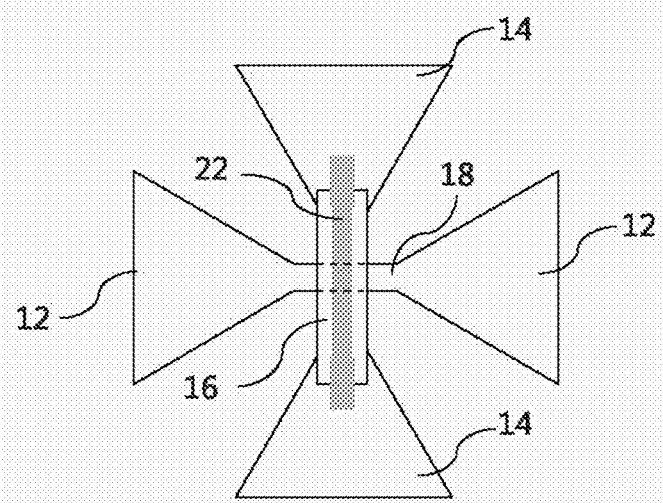

FIG. 4 shows the detailed sub-steps of the step S4. So, the step of forming the electro-conductive layer includes the following sub-steps. Start in step S4-1, an electro-conductive material is sputtered onto the substrate. In step S4-2, a photoresist is applied onto the substrate. In step S4-3, the optical compensation mask having a wire pattern corresponding to the wires is provided and the wire pattern is over-exposed onto the photoresist. In step S4-4, the wire pattern is developed to form the neighboring patterned blocks, wherein the wire pattern is generated by way of over-exposure and over-development. In addition, the step of forming the electro-conductive layer may further include adjusting an optical energy for exposure and making the optical energy and the optical compensation mask generate reactions there between in conjunction with the optical compensation mask to compensate for critical dimension loss of the wires. For example, the pattern generated by the optical compensation mask may be shown by the wire pattern depicted by the thick black lines of FIGS. 7a and 7b. FIG. 7a shows the wire having the equal line diameter width generated by the optical compensation mask, while FIG. 7b shows the wire having the unequal line diameter width generated by the optical compensation mask, wherein the terminal of wire have a wide line width.

Figure 5:
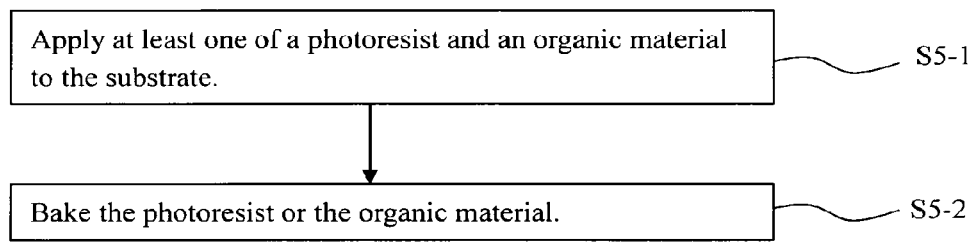

FIG. 5 shows the detailed sub-steps of the step S5. So, the step of forming the protection layer includes the following sub-steps. Start in step S5-1, at least one of a photoresist and an organic material is applied to the substrate. In step S5-2, the photoresist or the organic material is baked to form a hard protection film. In addition, in another embodiment, if the protection layer is not used all over the entire area of the substrate, it is further possible to include, after the step S5-1, the sub-steps of providing a mask having a protection region pattern, exposing the protection region pattern onto the photoresist or the organic material through the mask, and developing the protection region pattern onto the photoresist or the organic material. In the step S5-2, the photoresist or the organic material is baked to form a hard protection film.

Figure 7C:
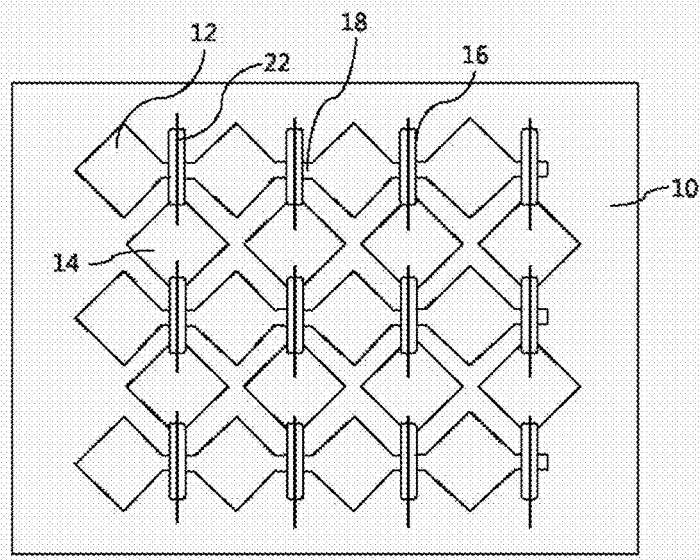
Figure 7D:
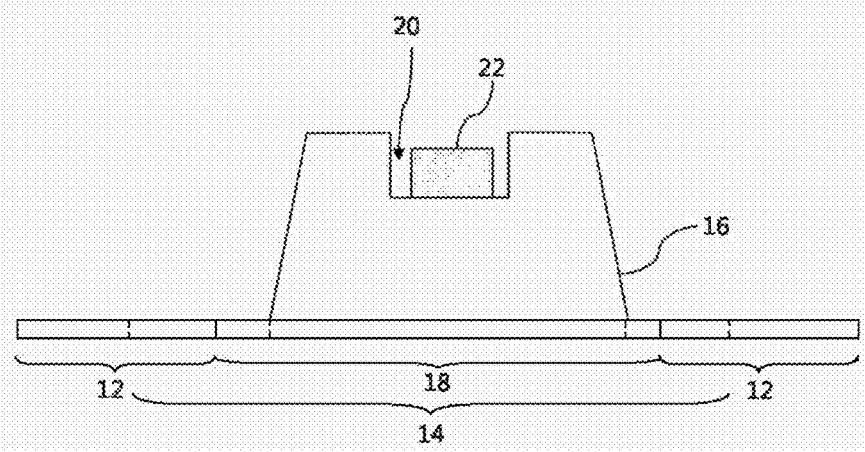

FIGS. 7c and 7d are schematic illustrations showing structures of bridging electrodes according to an embodiment of the present invention. In FIG. 7c, a structure of a bridging electrode applied to a capacitive touchpad is provided. The structure of the bridging electrode includes a substrate 10, multiple first electrode blocks 12, multiple second electrode blocks 14 and a bridging insulation unit 16. The material of the substrate 10 may be a glass material, namely the substrate 10 may be a glass substrate. The first electrode blocks 12 are disposed on the substrate 10 and are electrically connected together in series through a first wire 18. The second electrode blocks 14 are disposed on the substrate 10 and respectively disposed on two sides of the first wire 18. The bridging insulation unit 16 is perpendicular to and disposed on the first wire 18 and has a bridging groove 20, as shown in FIG. 7d. The second electrode blocks 14 are electrically connected together in series through a second wire 22 and the bridging insulation unit 16. The first electrode block 12, the second electrode block 14, the first wire 18 and the second wire 22 are made of a transparent or a non-transparent electro-conductive material, such as Indium tin oxide (ITO). Furthermore, the first wire 18 and the second wire 22 have a molybdenum-aluminum-molybdenum (MO—AL—MO) structure. In addition, the structure of the bridging electrode further includes at least one protection layer disposed on one side, the other side or two sides of the structure of the bridging electrode, and the protection layer is made of an organic material or a photoresist. The material of the photoresist may be, for example, silicon dioxide ($SiO_2$).

Figure 8A:
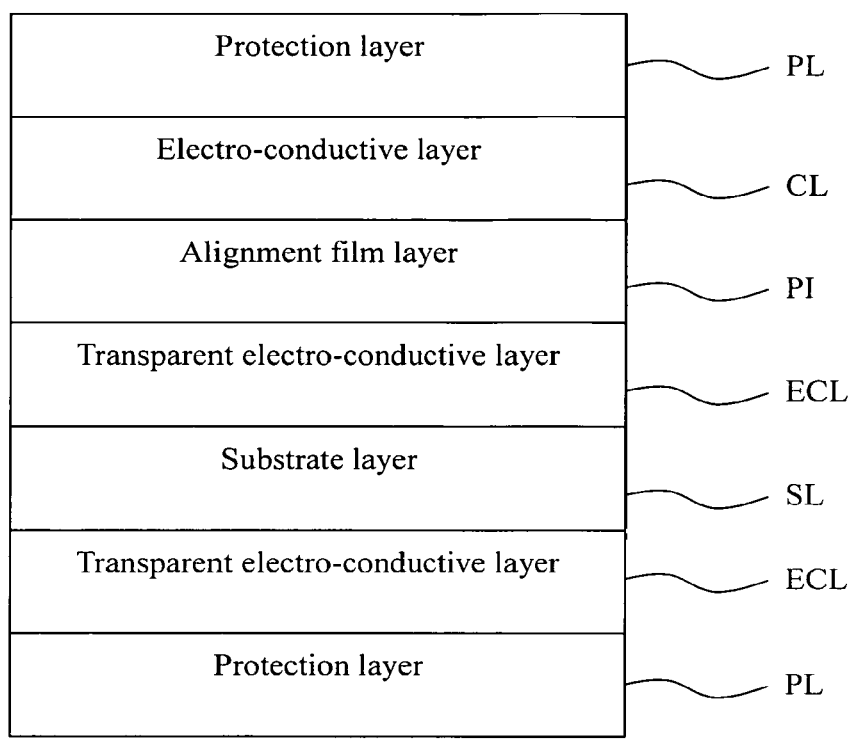
FIGS. 8a to 8c are layers diagram of bridging electrodes according to an embodiment of the present invention.
Figure 8B:
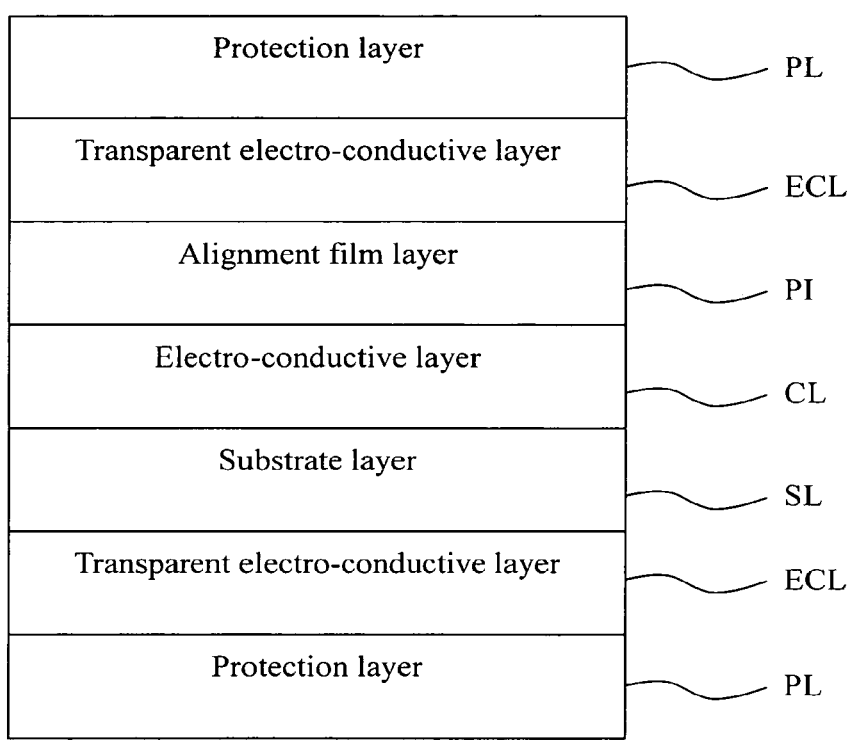
Figure 8C:
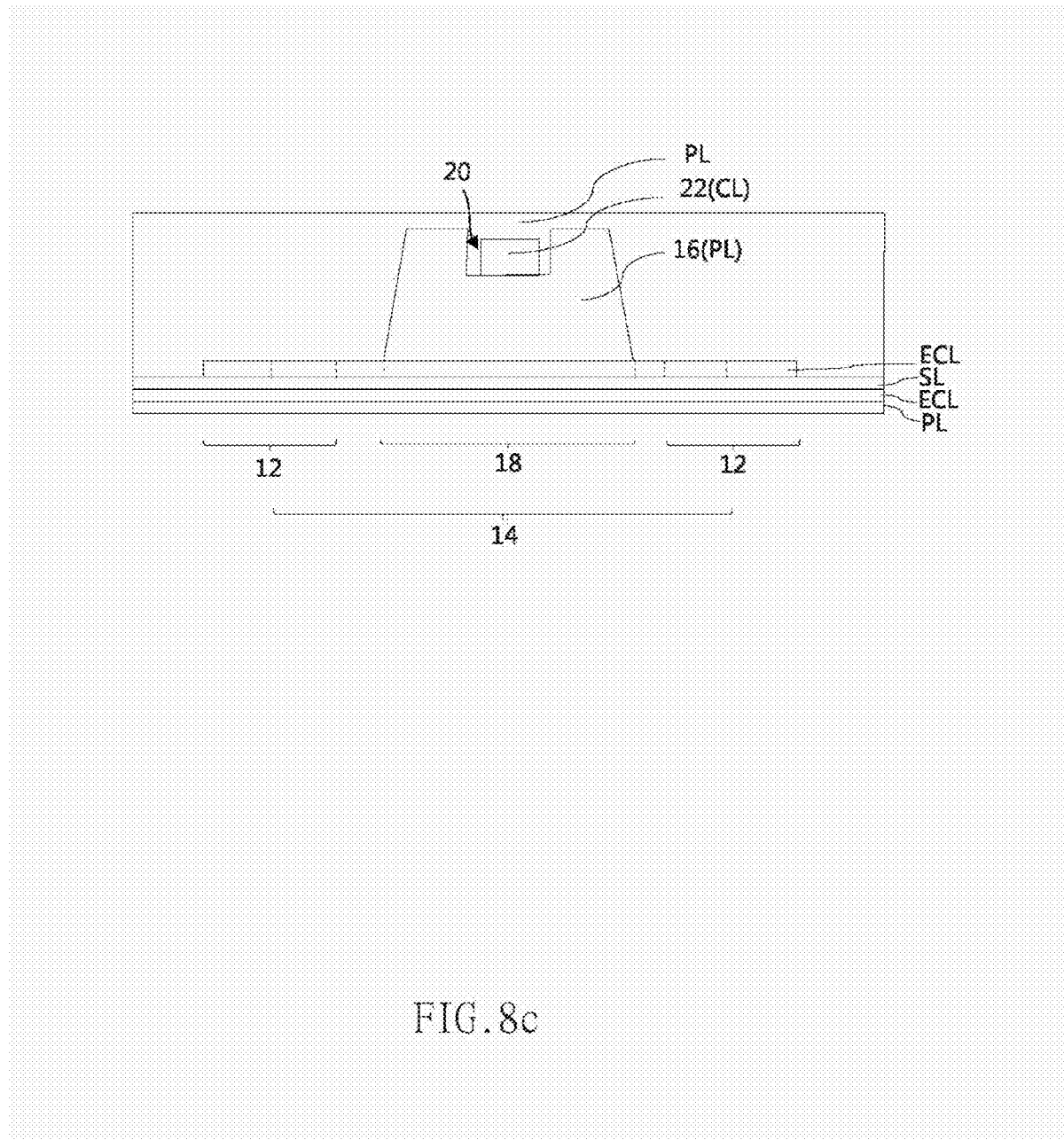

FIGS. 8a and 8b are lavers diagram of bridging electrodes according to an embodiment of the present invention. Wherein sectional view of the FIG. 8a is shown as FIG. 8c. In this embodiment, the structure of the bridging electrode is applied to a capacitive touchpad and includes a substrate layer SL, a transparent electro-conductive layer ECL, an alignment film layer PI and an electro-conductive layer CL. The transparent electro-conductive layer ECL is disposed on at least one side of the substrate layer SL. The alignment film layer PI is disposed on one side of the substrate layer SL and the transparent electro-conductive layer ECL. The electro-conductive layer CL is disposed adjacent to one side of the alignment film layer PI, and the electro-conductive layer CL may have a MO-AL-MO structure. In addition, a protection layer PL is disposed on at least one side of the structure of the bridging electrode. The protection layer PL may be an organic material layer, a photoresist layer, an anti-reflective (AR) layer, an anti-gloss (AG) layer or a combination thereof.

Those skilled in the art may understand that the protection layer PL may also be omitted, and the order of the manufacturing processes for the layers may be modified according to the requirements.

Comparison between the present invention and the prior art will be made in the following. In the layout method and the structure of the bridging electrode of the present invention, the bridging groove of the bridging insulation unit is formed through the mask having the half tone pattern such that the electrodes extending in two directions on one substrate may be insulated from each other when the connections between the electrodes are created. In addition, the structure having the bridging groove lower than the height of the bridging insulation unit enhances effectively the yield of the manufacturing process.

New characteristics and advantages of the present invention covered by this document have been set forth in the foregoing description. It is to be expressly understood, however, that the drawings are for the purpose of illustration only and are not intended as a definition of the limits of the present invention. Changes in methods, shapes, structures or devices may be made in details without exceeding the scope of the present invention by those who are skilled in the art. The scope of the present invention is, of course, defined in the language in which the appended claims are expressed.

What is claimed is:

1. A structure of a bridging electrode applied to a capacitive touchpad, the structure comprising:
   a substrate layer;
   a transparent electro-conductive layer disposed on at least one side of the substrate layer, wherein the transparent electro-conductive layer has a plurality of neighboring patterned blocks;
   an alignment film layer disposed on one side of the substrate layer and the transparent electro-conductive layer, wherein the alignment film layer has a plurality of bridging grooves, the plurality of bridging grooves crossing between the patterned blocks, a conductive wire disposed in the bridging grooves connecting two adjacent patterned blocks; and
   an electro-conductive layer disposed adjacent to the one side of the alignment film layer.

2. The structure according to claim 1, further comprising a protection layer disposed on at least one side of the substrate layer.

3. The structure according to claim 2, wherein the protection layer is an organic material layer, a photoresist layer, an anti-reflective (AR) layer, an anti-gloss (AG) layer or a combination thereof.

\* \* \* \* \*